United States Patent
Götz et al.

(10) Patent No.: US 10,412,822 B2
(45) Date of Patent: Sep. 10, 2019

(54) ELECTRICAL CONTACTING ARRANGEMENT

(71) Applicant: Dr. Ing. h.c. F. Porsche Aktiengesellschaft, Stuttgart (DE)

(72) Inventors: Stefan Götz, Forstern (DE); Pascal Scherz, Brücken (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 0 days.

(21) Appl. No.: 15/749,648

(22) PCT Filed: May 17, 2016

(86) PCT No.: PCT/EP2016/025045
§ 371 (c)(1),
(2) Date: Feb. 1, 2018

(87) PCT Pub. No.: WO2017/021008
PCT Pub. Date: Feb. 9, 2017

(65) Prior Publication Data
US 2018/0228020 A1    Aug. 9, 2018

(30) Foreign Application Priority Data
Aug. 4, 2015  (DE) .......................... 10 2015 112 785

(51) Int. Cl.
*H05K 1/11*  (2006.01)
*H05K 1/14*  (2006.01)
(Continued)

(52) U.S. Cl.
CPC ....... *H05K 1/0263* (2013.01); *H01R 12/7088* (2013.01); *H05K 7/026* (2013.01);
(Continued)

(58) Field of Classification Search
CPC ............. H01R 12/7088; H05K 1/0263; H05K 2201/10166; H05K 2201/10272; H05K 7/026
See application file for complete search history.

(56) References Cited

U.S. PATENT DOCUMENTS 5,629,839 A * 5/1997 Woychik ................ H05K 3/366
361/784
6,183,301 B1 * 2/2001 Paagman ............. H01R 23/688
439/567

(Continued)

FOREIGN PATENT DOCUMENTS

DE   102012017799 A1   3/2013
JP     2001321973 A   11/2001

OTHER PUBLICATIONS

International Search Report and Written Opinion for International Application No. PCT/EP2016/025045, dated Sep. 19, 2016—10 Pages.

*Primary Examiner* — Yuriy Semenenko
(74) *Attorney, Agent, or Firm* — RatnerPrestia

(57) ABSTRACT

An electrical contact-making arrangement for electrical power components, having a printed circuit board for mounting the electrical power components, and a line element which is fixed to the printed circuit board. The line element has a metal main body and the main body has an electrical connection contact in order to electrically contact-connect the line element to the printed circuit board or one of the electrical components. The main body has a fastening section in order to fix the line element to the printed circuit board. The line element is produced separately from the printed circuit board, and the electrical connection contact and the fastening section are formed separately from one another.

13 Claims, 6 Drawing Sheets

(51) Int. Cl.
*H05K 1/02* (2006.01)
*H01R 12/70* (2011.01)
*H05K 7/02* (2006.01)

(52) U.S. Cl.
CPC .............. *H05K 2201/10166* (2013.01); *H05K 2201/10272* (2013.01)

(56) References Cited

U.S. PATENT DOCUMENTS

| | | | | |
|---|---|---|---|---|
| 6,833,997 | B1 * | 12/2004 | Jones, III | H05K 1/0263 361/760 |
| 7,746,650 | B2 * | 6/2010 | Hellinger | H01L 23/3672 165/185 |
| 9,105,598 | B2 * | 8/2015 | Stella | H01L 23/3672 |
| 10,098,240 | B2 * | 10/2018 | Liskow | H05K 3/328 |
| 2007/0215999 | A1 * | 9/2007 | Kashimoto | H01L 21/565 257/678 |
| 2009/0004888 | A1 * | 1/2009 | Soga | H05K 3/103 439/43 |

* cited by examiner

ELECTRICAL CONTACTING ARRANGEMENT

CROSS-REFERENCE TO RELATED APPLICATION S

This U.S. national phase patent application claims priority to PCT International Patent Application No. PCT/EP2016/025045, filed May 17, 2016, which claims priority to German Patent Application No. DE 102015112785.7, filed Aug. 4, 2015, the content of each application being incorporated by reference herein in its entirety.

FIELD OF THE INVENTION

The present invention relates to an electrical contacting arrangement for electrical power components, having a printed circuit board for mounting the electrical power components, a line element, that is fixed to the printed circuit board and has a metal main body, wherein the main body has an electrical connection contact, in order to electrically contact the line element with respect to the printed circuit board or one of the electrical components, and wherein the main body has a fastening portion, in order to fix the line element on the printed circuit board.

The present invention also relates to an electrical power control unit or a motor vehicle having at least one electrical power component.

BACKGROUND OF THE INVENTION

Such electrical contacting arrangements serve the purpose of electrically contacting power components, in particular motor vehicle, and carrying high driver currents, for example for supplying current to electrical machines.

It is generally known in the prior art to electrically contact power components for high-current applications without a printed circuit board by means of separate busbars and to carry the high driver currents by means of the busbars. Such power electronics without a housing of their own and having a central control unit are known for example from DE 10 2012 017 799 A1, which is incorporated by reference herein. Such busbar-based contactings of power components is however technically complex and requires high costs and a great installation space, with the result that busbar-based contacting is disadvantageous for the application in electrically powered motor vehicles.

A conventional PCB-based integration of power electronics in motor vehicles is not possible for high-current applications for driving electrical machines, since the high currents cause the electrical lines to undergo great thermal loading and require large line cross sections.

SUMMARY OF THE INVENTION

The object of the present invention is therefore to provide an electrical contacting of power components that can electrically contact power components in a way that requires little technical complexity and little installation space.

This object is achieved in the case of the electrical contacting arrangement mentioned at the beginning by the line element being produced separately from the printed circuit board and by the electrical connection contact and the fastening portion being formed separately from one another.

This object is achieved in the case of the power control unit mentioned at the beginning by an electrical contacting arrangement according to the present invention.

The fact that the line element is produced separately from the printed circuit board and can be fastened to the printed circuit board by the fastening portion means that the line element can be formed for example as an inexpensive stamped part and can carry correspondingly high currents with little resistance and little development of heat. The fact that the electrical connection contact and the fastening portion are formed separately from one another means that the line element can be fastened to the printed circuit board by a standard soldering process, since the fastening portion does not have to carry great currents and consequently is not exposed to great thermal loading. As an overall result, a PCB-based electrical contacting of the power components can be provided, so that low-cost integration of the power components is possible in a way that requires little installation space.

The object of the present invention is consequently achieved completely.

In a preferred embodiment, the rain body is arranged spaced apart om the printed circuit board.

As a result, the line element can be thermally decoupled from the printed circuit board, so that the thermal loading of the printed circuit board can be reduced and as a result the printed circuit board can be produced at lower cost.

In a preferred embodiment, the main body has a thermal contact portion, in order to contact the line element thermally.

As a result, the Joulean heat produced in the line element by the electrical current is removed from the line element, so that the thermal loading particularly of the mechanical and electrical contactings can be reduced.

In a preferred embodiment, the thermal contacting portion is formed separately from the electrical connection contact and separately from the fastening portion. As a result, the Joulean heat produced can be removed particularly effectively from the fastening portion of the line element.

In a preferred embodiment, the line element is formed as stamped part.

As a result, the line element can be separately produced in advance in a way that involves little technical complexity.

In a preferred embodiment, the electrical contacting arrangement has a plurality of line elements, which are fixed on the printed circuit board and are electrically and/or thermally connected to one another in each case by means of a connecting portion.

As a result, the electrical contacting of the power components can be realized by a plurality of standardized line elements, so that the electrical contacting of the power components can be performed in a modular manner in a way that involves little technical complexity.

In this case, it is particularly preferred if the connecting portions are formed as couplings, which form a surface-area contact between two of the line elements.

As a result, a thermally good contact can be formed between the line elements.

In this case, it is also preferred if the couplings are formed as complementary.

As a result, the line elements can be contacted respect to one another in a modular manner in a way that involves little technical complexity, so that any desired electrical contacting on the printed circuit board is possible.

It is also preferred if the fastening portion is fixed on the printed circuit board by means of a soldered connection.

As a result, the line element can be fixed on the printed circuit board in a way that involves little technical complexity by means of a standard process.

It is also preferred if the electrical contact with respect to the printed circuit board is formed as a pressure contact.

As a result, the electrical contact with the printed circuit board can be provided in a way that involves little technical complexity.

It is also preferred if the thermal contact portion is formed as an arcuate end portion of the main body.

As a result, robust and effective contacting with little contact resistance can be provided.

It is also preferred if the main body is formed as a hollow body.

As a result, the line element can be provided such that it has a low weight and at the same time an effective convective cooling property.

It is also preferred if the main body has clearances, which are assigned to the fastening portion, in order to decouple the fastening portion thermally from the main body.

As a result, thermal loading of the soldered connections of the fastening portion can be reduced, so that the reliability of the fastening is increased further.

It is also preferred if the fastening portion has a plurality of elongate soldering portions, which are thermally decoupled from the main body in each case by means of at least one clearance or a narrowing portion.

As a result, the thermal loading of the soldering portions can be reduced further, so that the reliability of the soldered connection to the printed circuit board can be increased overall.

In a preferred embodiment, the metallic main body is formed from aluminum, copper, copper-aluminum bimetal or copper steel.

As a result, a low electrical resistance of the main body can be provided in a way that requires little technical complexity.

Overall, the separate production of the line element allows the electrical contacting of the power components to be provided by means busbars, for example as stamped parts, so that a high current carrying capacity and a low electrical resistance can be achieved. Furthermore, the line element can be securely connected to the printed circuit board by means of the fastening portion by a standard process, for example a soldering process, since the fastening portions are formed separately from electrical connection contacts and are therefore exposed to significantly lower thermal loading.

As a result, integration of the power components on a standard printed circuit board is possible, so that the power components can be contacted in way that requires little technical complexity and little installation space.

In particular, the technical complexity for contacting the power components may take the form of modular electrical contacting by means of a plurality of line elements, which as a standard kit may be of any desired forms, so that any desired arrangements can be realized on the printed circuit board.

As a result, the technical complexity for the electrical contacting of the power components can be reduced further.

It goes without saying that the features mentioned above and still to be explained below can be used not only in the combination that is respectively specified but also in other combinations or on their own without departing from the scope of the present invention.

BRIEF DESCRIPTION OF THE DRAWINGS

Exemplary embodiments of the invention are explained in more detail in the description that follows and are represented in the drawing, in which.

DETAILED DESCRIPTION OF THE INVENTION

Figure 1:
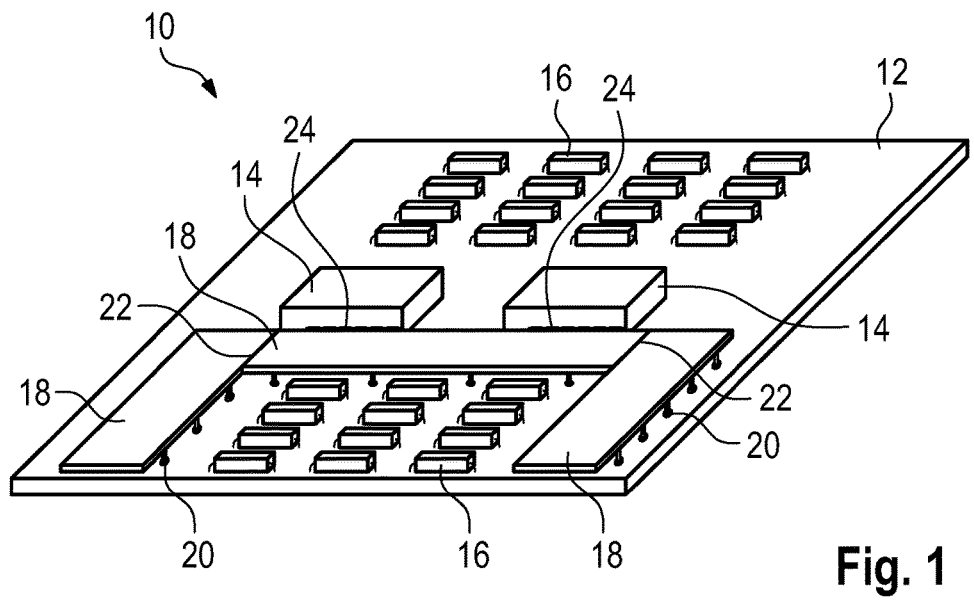
FIG. 1 shows a schematic perspective view of a printed circuit board electrical power components.

In FIG. 1, an electrical contacting arrangement for electrical power components is shown in a schematic perspective view and is denoted generally by 10. The contacting arrangement 10 has a printed circuit board 12 or PCB 12, on which a plurality of electrical power components 14 are mounted or fixed. Also fixed on the printed circuit board 12 are a plurality of further electrical components 16, which may be formed as passive or active components.

Also arranged on the printed circuit board 12 are a plurality of metallic line elements 18, which are fixed on the printed circuit board 12 and electrically contact the power components 14. The line elements 18 have connecting portions 20, which are connected to the printed circuit board 12 by means of soldered connections, so that the line elements 18 are fixed on the printed circuit board 12. Two of the line elements 18 in each case are electrically or thermally connected to one another by means of a connecting portion 22, in order to realize an electrical and thermal connection between the power components 14. One of the line elements 18 is electrically connected to the power components 14 by means of electrical connection contacts 24, in order to electrically contact the power components 14.

The line elements 18 are produced separately from the printed circuit board 12 and are preferably formed as metallic stamped parts, so that a high current carrying capacity and a low electrical resistance of the line elements 18 can be provided.

The fact that the line elements 18 are produced separately from the printed circuit board 12 and can be connected to the printed circuit board 12 by means of the fastening portions 20, for example by means of a standard process, means that the power components 14 can be integrated on the printed circuit board 12 at low cost and in a way that requires little installation space and can be electrically contacted electrically by means of the line elements 18.

The line elements 18 are preferably fixed on the printed circuit board 12 while spaced apart from the printed circuit board 12, so that the printed circuit board 12 is exposed to little thermal loading, and therefore integration of the power components 14 on the printed circuit board 12 is possible. The fastening portions 20 are formed separately from the electrical connection contacts 24, so that the thermal loading of the fastening portions 20 and of the soldered connections can be reduced, so that the line elements 18 can be fixed on the printed circuit board 12 by a standard soldering process in spite of the high currents in the line elements 18.

The power components 14 are preferably electrically contacted by means of a plurality of line elements 18, wherein the line elements 18 are electrically and thermally connected to one another, so that the line elements 18 can be produced as standard components, for example in a stamping process, and can correspondingly be connected to the printed circuit board 12. As a result, the contacting arrangement 10 can be produced altogether as a kit for different applications and arrangements of the power components 14, so that the overall technical complexity for producing the contacting arrangement 10 is reduced.

In an alternative embodiment, the line elements 18 may also be produced individually, for example by a finite element optimization, so that an optimum structural form can be achieved.

The line elements 18 preferably have a thermal contacting, in order that Joulean heat which is produced by the electrical current in the line elements 18 can be dissipated, and thus the overall thermal loading is reduced.

The line elements 18 are preferably produced from aluminum, copper, copper-aluminum bimetal or from copper steel and can be created in an automated stamping process, for example as copper stamped grids.

Figure 2:
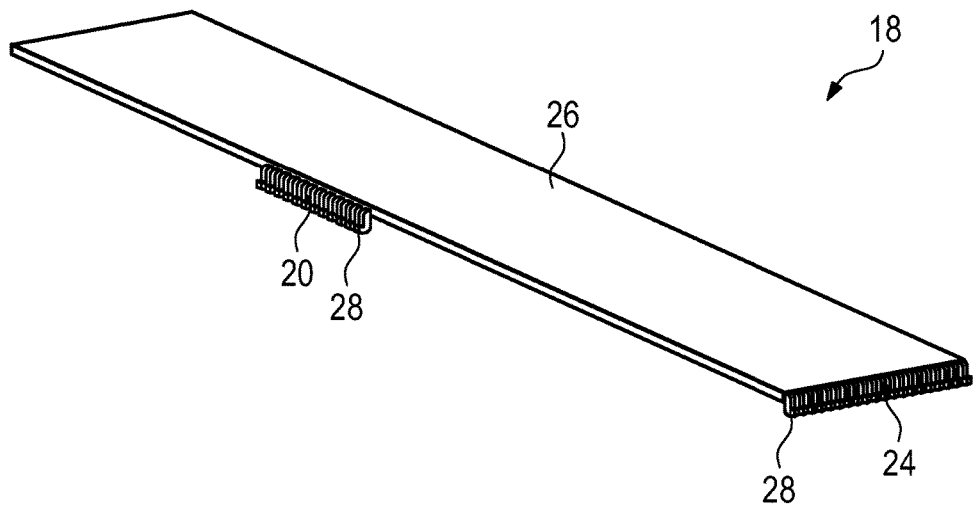
FIG. 2 shows a perspective view of a line element for contacting the electrical power components.

In FIG. 2, a perspective view of an embodiment of a line element 18 is represented. The line element 18 has a main body 26, on which the connecting portion 22 and the electrical connection contact 24 are formed. The connecting portion 22 has a plurality of solder lugs 28, which are formed so as to securely contact the main body 26 with respect to the printed circuit board 12 by means of a standard soldering process. The electrical connection contact 24 has a plurality of solder lugs 28, in order to connect the power components 14 electrically to the main body 26. At an end of the main body 26 opposite from the electrical connection contact 24 there may be formed a thermal contact with respect to a further line element 18 or with respect to an external temperature sink.

Figure 3:
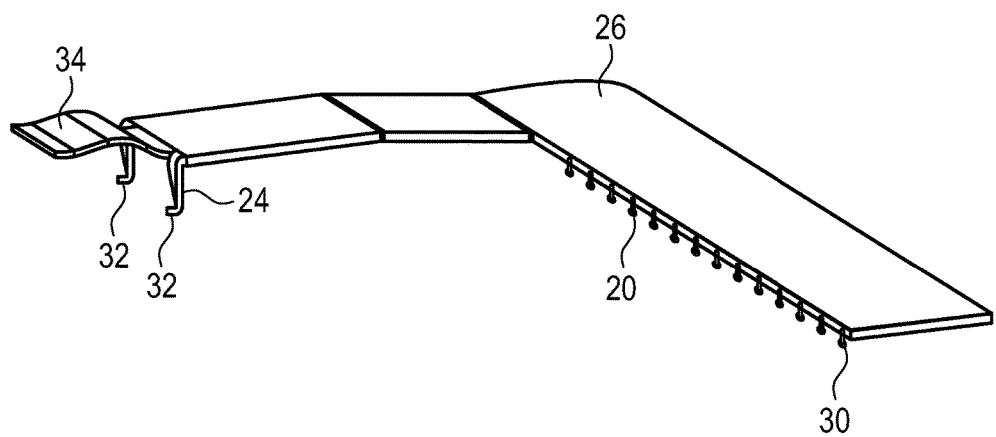
FIG. 3 shows an alternative embodiment of the line element for contacting the electrical power components.

In FIG. 3, an alternative embodiment of the line element 18 is represented. The line element has the main body 26, on which the fastening portion 20 is formed. The fastening portion 20 has a plurality of feet 30 for mechanically fastening the main body 26 on the printed circuit board 12, wherein the feet can be advantageously fixed on the printed circuit board 12 by means of SMD soldering or crimping. In this embodiment, the electrical connection contact 24 is formed as a solder foot 32, wherein the electrical connection contact 24 is formed separately from the fastening portion 20, so that the thermal loading of the solder contacts 30 of the fastening portion 20 is reduced. Arranged between the solder feet 32 is a heat conducting element 34, that can be thermally connected to one of the electrical power components 14 according to the positioning between the solder feet 32, so that lost heat of the power component 14 can be removed by way of the line element 18. The heat conducting element 34 is formed as a spring element, so that the thermal contact with a surface of the power component 14 can be produced by the spring force of the heat conducting element 34. Particularly easy assembly is possible as a result.

Figure 4:
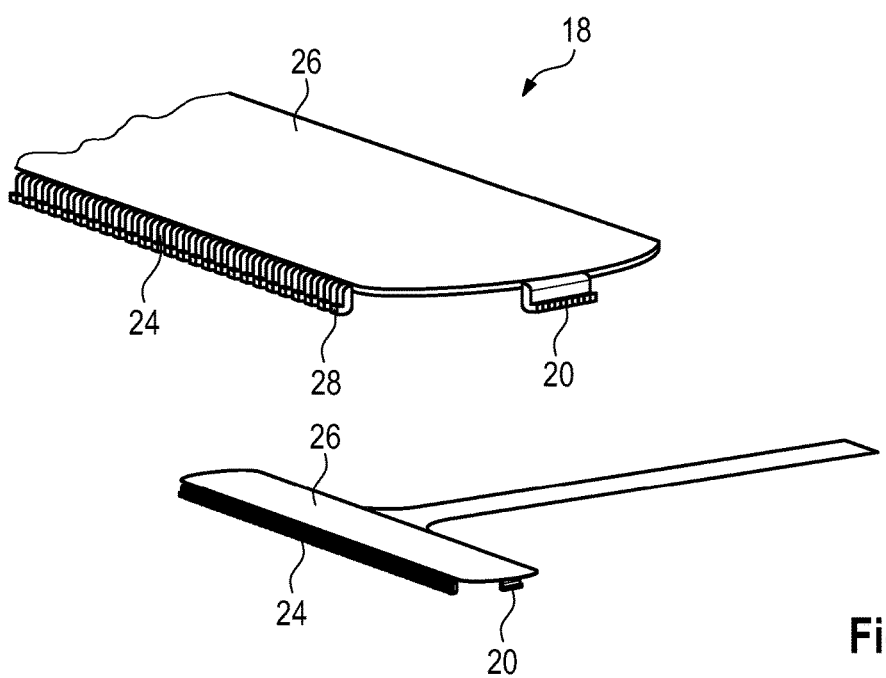
FIG. 4 shows a perspective representation of an alternative embodiment of the line element for contacting the electrical power components.

In FIG. 4, a further embodiment of the line element 18 is represented, wherein the main body 26 is formed in a T-shaped manner and has at a head end the electrical connection contact 24, which has a plurality of solder lugs 28. Formed separately from the electrical connection contacts is the fastening portion 20, in order to fasten the main body 26 mechanically on the printed circuit board 12. As a result, the thermal loading of the fastening portion 20 can be reduced.

The different forms of the main body 26 allow any desired arrangements of the power components 14 on the printed circuit board 12 to be realized and electrically contacted in a modular manner by standardized line elements 18.

Figure 5:
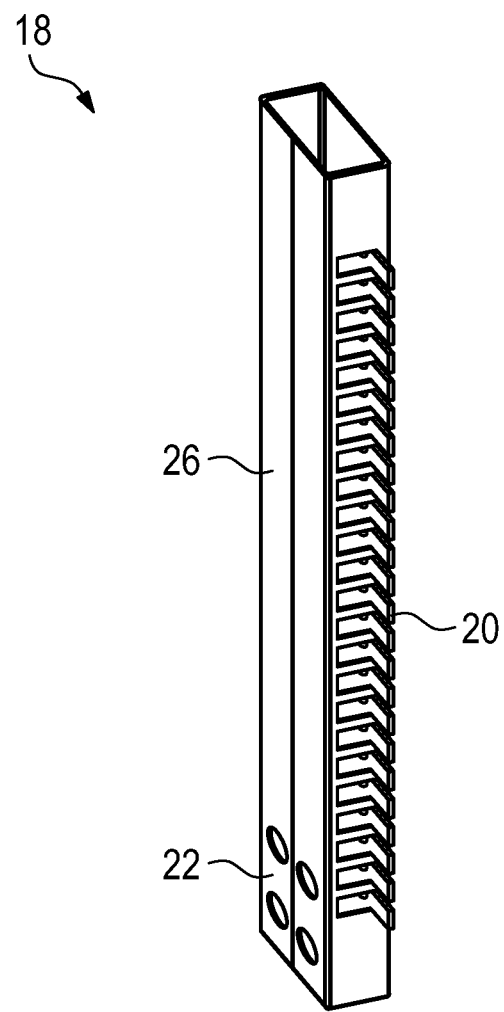
FIG. 5 shows an alternative embodiment of the line element for contacting electrical power components having a hollow body.

In FIG. 5, a further embodiment of the line element 18 is represented in a perspective view. In this embodiment, the main body 26 is formed as an elongate hollow body, on which the fastening portions 20 is formed laterally and the connecting portions 22 is formed at an axial end, in order to connect the main body 26 to a further line element 18. The hollow-formed main body 26 allows convective heat dissipation to be provided, while in the vertical alignment represented here an advantageous chimney effect can increase the convective heat transfer. Furthermore, in this embodiment the hollow main body 26 allows the weight of the line element 18 to be reduced. With the hollow structure of the main body 26, the skin effect can be used for high-frequency currents.

In FIGS. 6a to 6e, various embodiments of the line element 18 are represented, and these can be variously connected to one another and so a modular system for contacting various power components 14 can be provided.

Figure 6A:
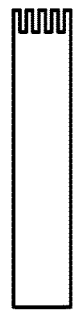
FIGS. 6a through 6e show various forms of the line element for contacting electrical power components.
Figure 6B:
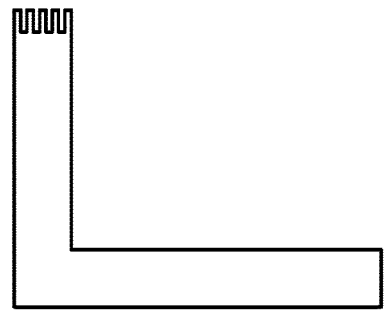
Figure 6C:
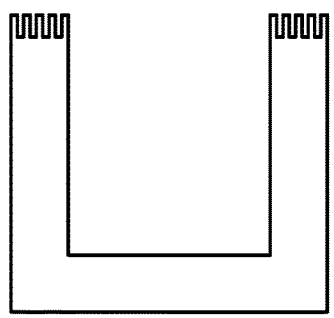
Figure 6D:
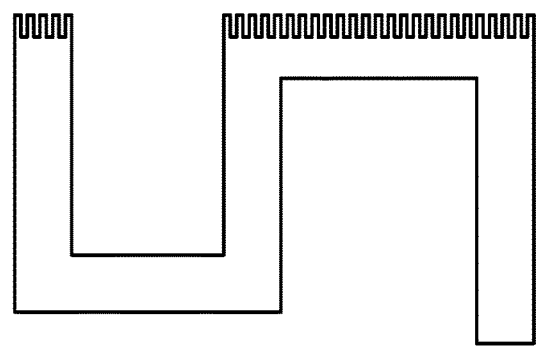
Figure 6E:
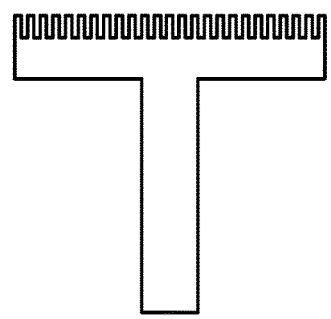

In FIG. 6a, an elongate I shape of the line element 18 is represented, in FIG. 6b angled L shape of the line element 18 is represented in FIG. 6c a multi-angled U shape of the line element 18 is represented, in FIG. 6d an S shape of the line element 18 is represented and in FIG. 6e a T shape of the line element 18 is represented.

The various forms can be provided as standard as stamped parts, and thus various arrangements can be contacted on the printed circuit board 12.

Figure 7A:
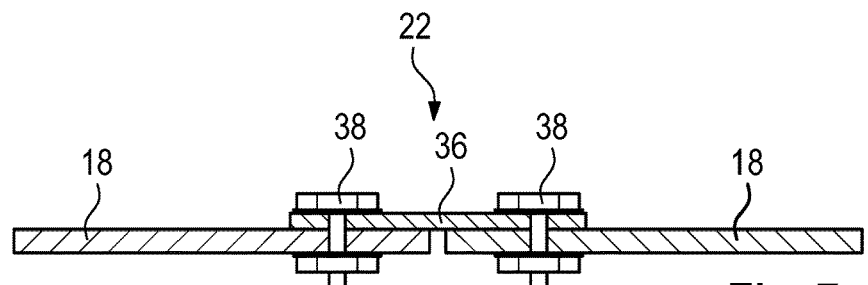
FIGS. 7a through 7d show schematic sectional views of various contactings between the line elements.

In FIGS. 7a-d various embodiments of the connecting portions 22 between two line elements 18 are represented, in order to form an electrical and thermal connection between two line elements 18. In FIG. 7A, a screwed connection is represented, a connection which electrically and thermally connects the line elements 18 to one another by means of a connecting element 36 and a number of screws 38.

Figure 7B:
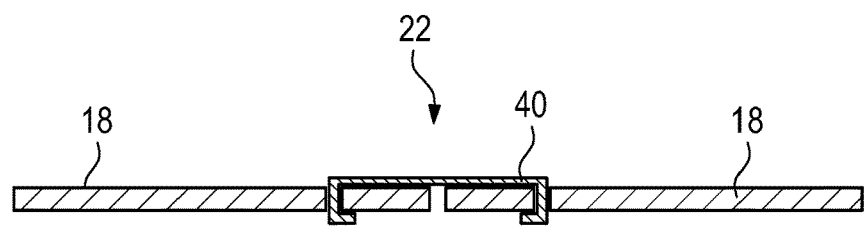

In FIG. 7b, a clamped connection is represented as a connecting portion 22, wherein the line elements 18 are connected to one another by way of a clamping bracket 14.

Figure 7C:
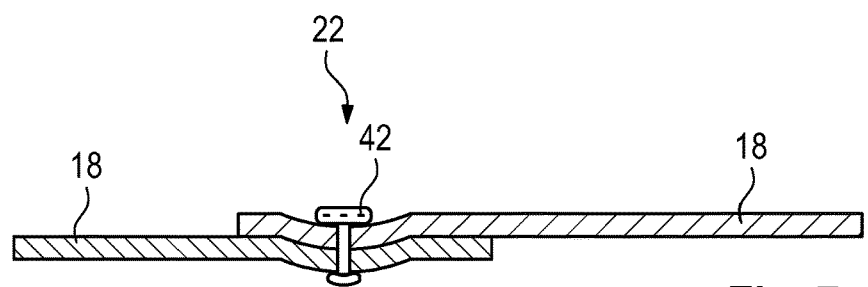

In FIG. 7c, a riveted connection is represented, wherein a rivet 42 securely connects the overlap of the line elements 18 to one another. The line elements 18 are formed as bent in the region of the connecting portion 22, so that an improved bearing surface can be formed between the line elements 18.

Figure 7D:
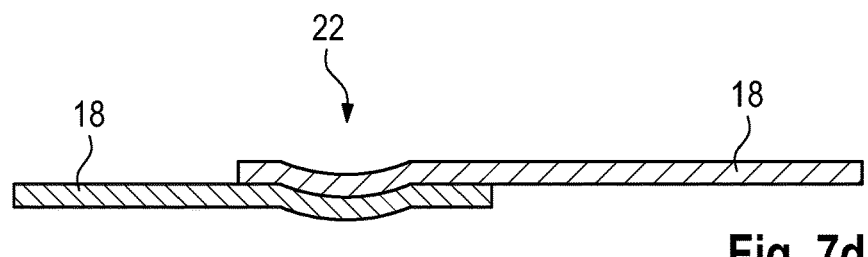

In FIG. 7d, a simple overlapping bent connection between the line elements 18 is represented. The bent portions of the line elements 18 in this case engage in one another and form a common contact area.

Figure 8A:
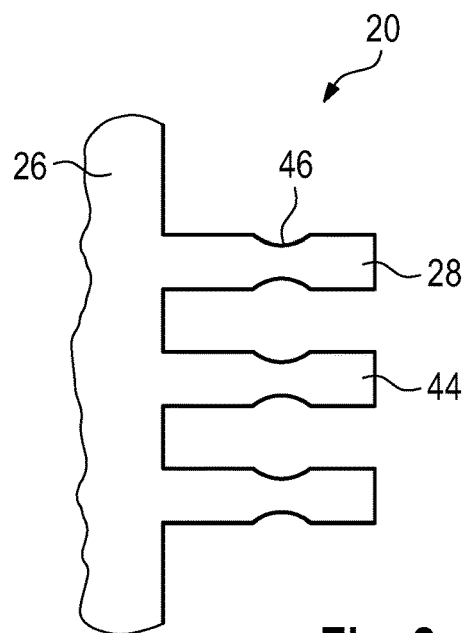
FIGS. 8a and 8b show schematic sectional views of various thermally decoupled soldering elements for connecting the line elements to the printed circuit board.
Figure 8B:
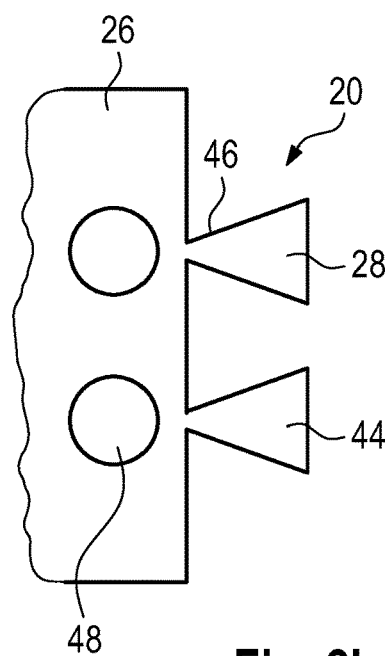

In FIGS. 8a and 8b, various embodiments of the fastening portion 20 are represented, wherein the fastening portion 20 has a plurality of solder lugs 28, in order to fix the main body 26 on the printed circuit board 14 by means of a soldering process.

The solder lugs 28 have in this case at their outer end a soldering portion 44, which is soldered to the printed circuit board 12 by means of a solder. The solder lugs 28 have in each case a narrowing 46, which is formed between the soldering portion 40 and the main body 26, so that the thermal conductivity of the solder lugs 28 is reduced. The narrowings 46 are formed as a clearance or constriction of the solder lugs 28.

In one particular embodiment, as shown in FIG. 8B, in the main body 26 there may be formed alongside the solder lugs 28 clearances 48, which serve as heat traps or as thermal decoupling, and thus reduce the heat transfer before the main body 26 to the solder lugs 28 or the soldering portions 44, so that the thermal loading of the solder connection is reduced further. As a result, the line elements 18 can be mechanically connected to the printed circuit board 12 by means of a standard soldering process, so that the technical complexity required for contacting the line elements 18 is reduced further.

The invention claimed is:

1. An electrical contacting arrangement for electrical power components, comprising:
    a printed circuit board for mounting the electrical power components,
    a plurality of line elements fixed to the printed circuit board and electrically or thermally connected to one another in each case by a connecting portion, wherein each line element has a metal main body, wherein the metal main body has an electrical connection contact in order to electrically contact the respective line element with respect to the printed circuit board or one of the electrical power components, and wherein the metal main body has a fastening portion in order to fix the respective line element on the printed circuit board, and
    wherein each line element is formed separately from the printed circuit board and the electrical connection contact and the fastening portion are formed separately from one another.

2. The electrical contacting arrangement as claimed in claim 1, wherein the metal main body is spaced apart from the printed circuit board.

3. The electrical contacting arrangement as claimed in claim 1, wherein the metal main body has a thermal contact portion for thermally contacting the respective line element.

4. The electrical contacting arrangement as claimed in claim 3, wherein the thermal contact portion is formed separately from the electrical connection contact and separately from the fastening portion.

5. The electrical contacting arrangement as claimed in claim 1, wherein each line element is formed as a stamped part.

6. The electrical contacting arrangement as claimed in claim 1, wherein each connecting portion is formed as a coupling, which forms a surface area contact between two of the line elements.

7. The electrical contacting arrangement as claimed in claim 1, wherein the fastening portion is fixed on the printed circuit board by a soldered connection.

8. The electrical contacting arrangement as claimed in claim 1, wherein the electrical contact is formed as a pressure contact with respect to the printed circuit board.

9. The electrical contacting arrangement as claimed in claim 4, wherein the thermal contact portion is formed as an arcuate end portion of the metal main body.

10. The electrical contacting arrangement as claimed in claim 1, wherein the fastening portion has a plurality of elongate soldering portions, which are thermally decoupled from the metal main body in each case by at least one clearance or a narrowing portion.

11. An electrical power control unit for a motor vehicle, having at least one of the electrical power components and the electrical contacting arrangement as claimed in claim 1.

12. An electrical contacting arrangement for electrical power components, comprising:
    a printed circuit board for mounting the electrical power components,
    a line element fixed to the printed circuit board, wherein the line element has a metal main body, wherein the metal main body has an electrical connection contact in order to electrically contact the line element with respect to the printed circuit board or one of the electrical power components, and wherein the metal main body is formed as a hollow body and has a fastening portion in order to fix the line element on the printed circuit board, and
    wherein the line element is formed separately from the printed circuit board and the electrical connection contact and the fastening portion are formed separately from one another.

13. An electrical contacting arrangement for electrical power components, comprising:
    a printed circuit board for mounting the electrical power components,
    a line element fixed to the printed circuit board, wherein the line element has a metal main body, wherein the metal main body has an electrical connection contact in order to electrically contact the line element with respect to the printed circuit board or one of the electrical power components,
    wherein the metal main body has clearances, which are assigned to the fastening portion, in order to thermally decouple the fastening portion from the metal main body, and has a fastening portion in order to fix the line element on the printed circuit board, and
    wherein the line element is formed separately from the printed circuit board and the electrical connection contact and the fastening portion are formed separately from one another.

* * * * *